(12) United States Patent
Dogiamis et al.

(10) Patent No.: US 11,221,354 B2
(45) Date of Patent: Jan. 11, 2022

(54) SWITCHED CLOSED LOOP READ-OUT METHODS AND SYSTEMS FOR RESONANT SENSING PLATFORMS

(71) Applicant: Intel Corporation, Santa Clara, CA (US)

(72) Inventors: Georgios C. Dogiamis, Chandler, AZ (US); Sasha N. Oster, Chandler, AZ (US); Feras Eid, Chandler, AZ (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1367 days.

(21) Appl. No.: 15/201,144

(22) Filed: Jul. 1, 2016

(65) Prior Publication Data

US 2018/0003749 A1 Jan. 4, 2018

(51) Int. Cl.
*G01R 23/02* (2006.01)
*G01D 5/00* (2006.01)
(Continued)

(52) U.S. Cl.
CPC .............. *G01R 23/02* (2013.01); *G01D 5/00* (2013.01); *G01D 18/006* (2013.01);
(Continued)

(58) Field of Classification Search
CPC ........ G01R 23/02; G01D 5/00; G01D 18/006; G01P 15/097; H01L 24/00; H01L 24/13;
(Continued)

(56) References Cited

U.S. PATENT DOCUMENTS 5,586,091 A * 12/1996 Ishii .................. G11B 11/10508
360/59
5,905,201 A * 5/1999 Petri ...................... G01C 19/56
73/504.03
(Continued)

FOREIGN PATENT DOCUMENTS

CN 100447576 C 12/2008
WO WO 2014-138059 A1 9/2014
WO WO 2015-084980 A2 6/2015

OTHER PUBLICATIONS

International Preliminary Report on Patentability for International Patent Application No. PCT/US17/33385, dated Jan. 10, 2019, pages.
(Continued)

*Primary Examiner* — Douglas X Rodriguez
*Assistant Examiner* — Trung Q Nguyen
(74) *Attorney, Agent, or Firm* — Schwabe, Williamson & Wyatt, P.C.

(57) ABSTRACT

Embodiments of the invention include a resonant sensing system comprising driving circuitry to generate a drive signal during excitation time periods, a first switch coupled to the driving circuitry, and a sensing device coupled to the driving circuitry via the first switch during the excitation time periods. The sensing device includes beams to receive the drive signal during a first excitation time period that causes the beams to mechanically oscillate and generate a first induced electromotive force (emf) in response to the drive signal. The first switch decouples the sensing device and the driving circuitry during measurement time periods for measurement of the induced emf.

7 Claims, 11 Drawing Sheets

(51) Int. Cl.
*H01L 23/00* (2006.01)
*G01D 18/00* (2006.01)
*G01P 15/097* (2006.01)

(52) U.S. Cl.
CPC ............ *G01P 15/097* (2013.01); *H01L 24/13* (2013.01); *H01L 24/16* (2013.01); *H01L 2224/131* (2013.01); *H01L 2224/16227* (2013.01); *H01L 2924/10253* (2013.01); *H01L 2924/1432* (2013.01); *H01L 2924/1434* (2013.01); *H01L 2924/15159* (2013.01); *H01L 2924/15311* (2013.01)

(58) Field of Classification Search
CPC ... H01L 2924/1432; H01L 2924/15159; H01L 2924/1434; H01L 2924/15311; H01L 2924/10253; H01L 2224/16227; H01L 2224/131; H01L 24/16
USPC ............ 324/612, 637–661, 500, 600, 76.11, 324/76.26, 444, 447, 515, 559; 323/265, 323/268, 271, 222–225; 363/21.02–21.18, 97; 73/504.04–504.12, 73/862.192
See application file for complete search history.

(56) References Cited

U.S. PATENT DOCUMENTS

| | | | |
|---|---|---|---|
| 2007/0024269 A1* | 2/2007 | Tadatsu | G01R 21/06 324/127 |
| 2012/0051196 A1* | 3/2012 | Grobis | G11B 5/6088 369/13.24 |
| 2013/0193962 A1 | 8/2013 | Okatake et al. | |
| 2014/0076051 A1* | 3/2014 | Ma | G01P 15/105 73/514.29 |
| 2015/0082909 A1 | 3/2015 | Foss et al. | |
| 2015/0293243 A1* | 10/2015 | Avenson | G01V 1/18 73/1.85 |
| 2015/0366631 A1* | 12/2015 | Kovnatsky | A61C 1/07 433/27 |

OTHER PUBLICATIONS

International Search Report and Written Opinion for International Patent Application No. PCT/US17/33385, dated Jan. 10, 2019, 10 pages.

* cited by examiner

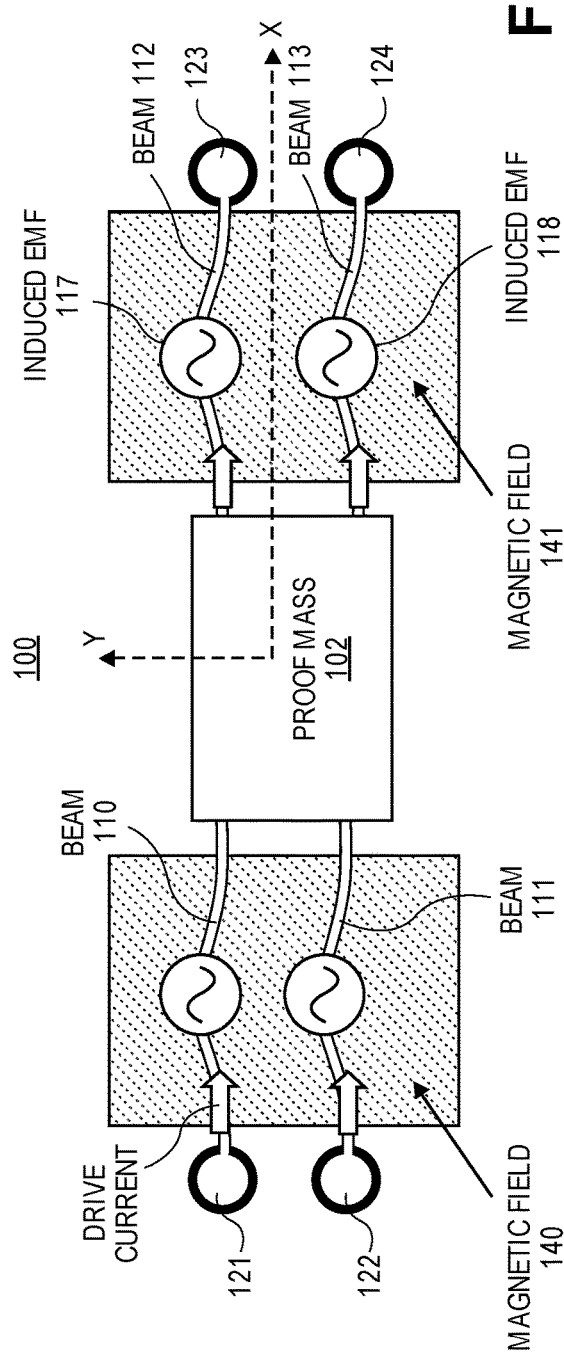
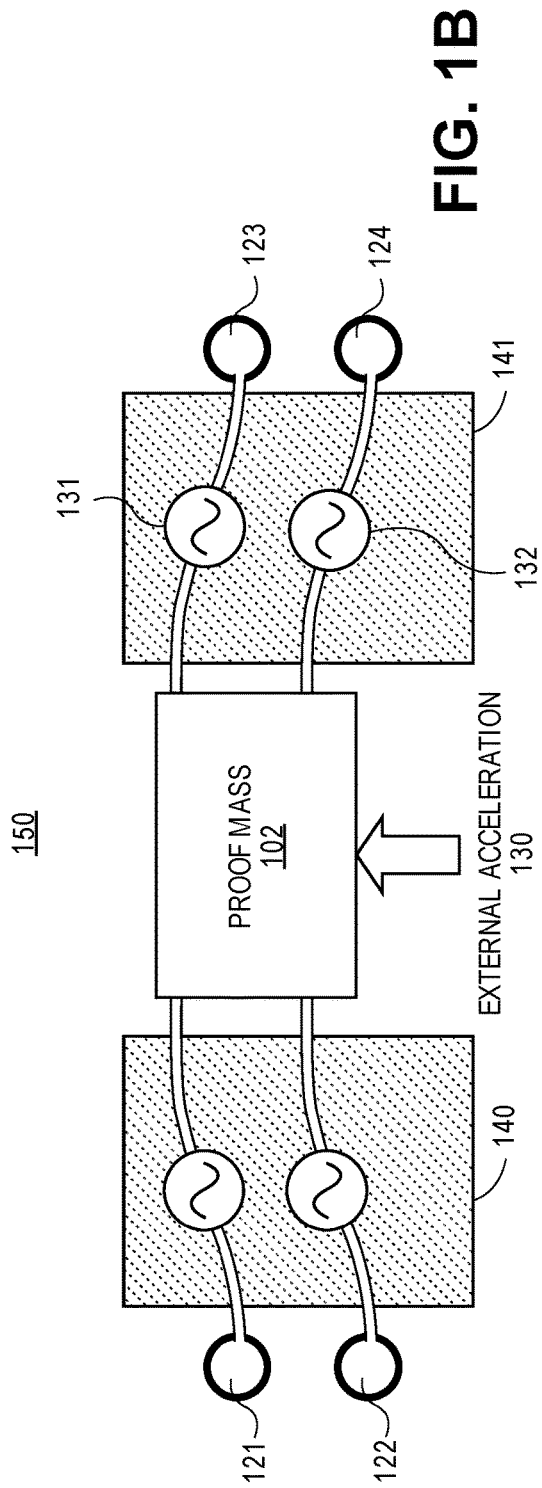

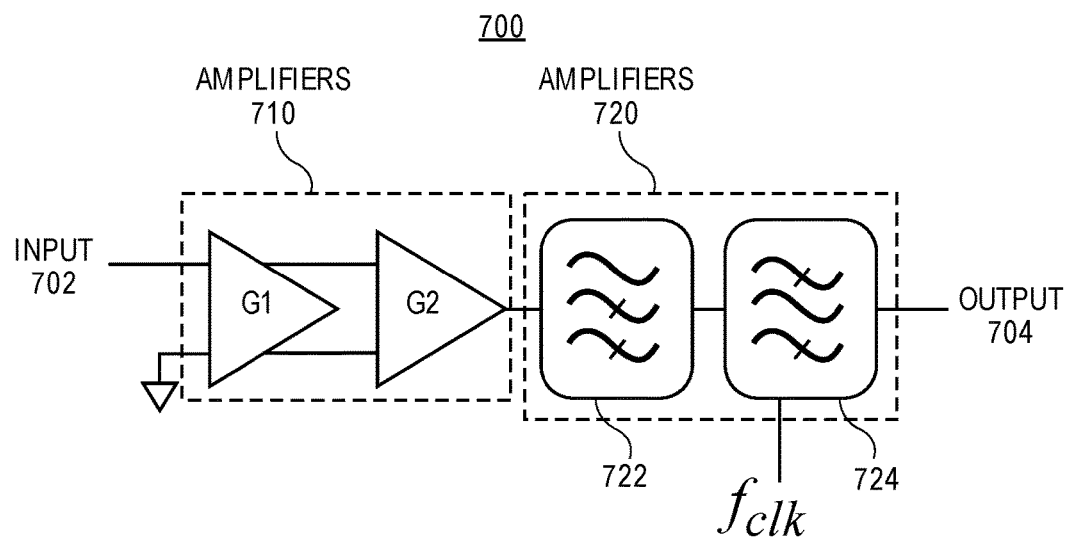
FIG. 7
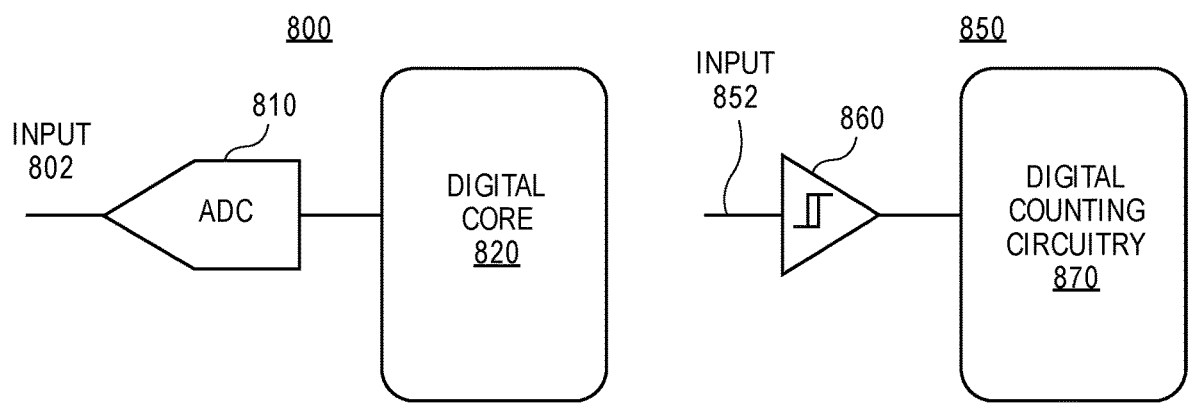
FIG. 8A  FIG. 8B

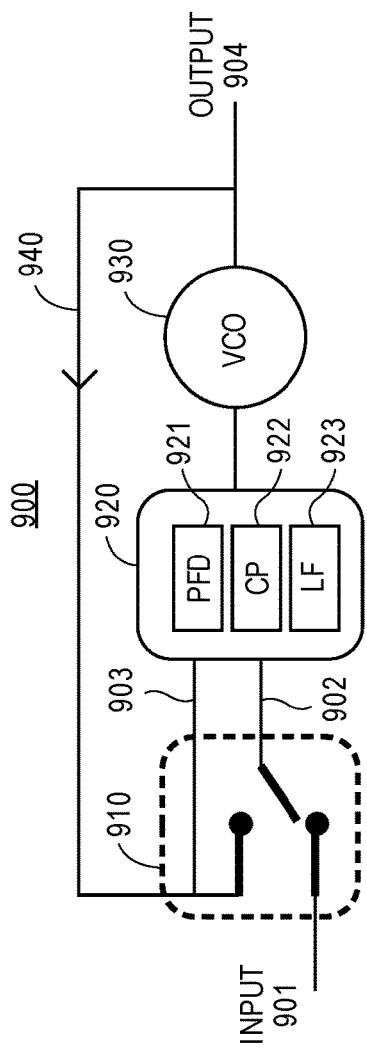
FIG. 9
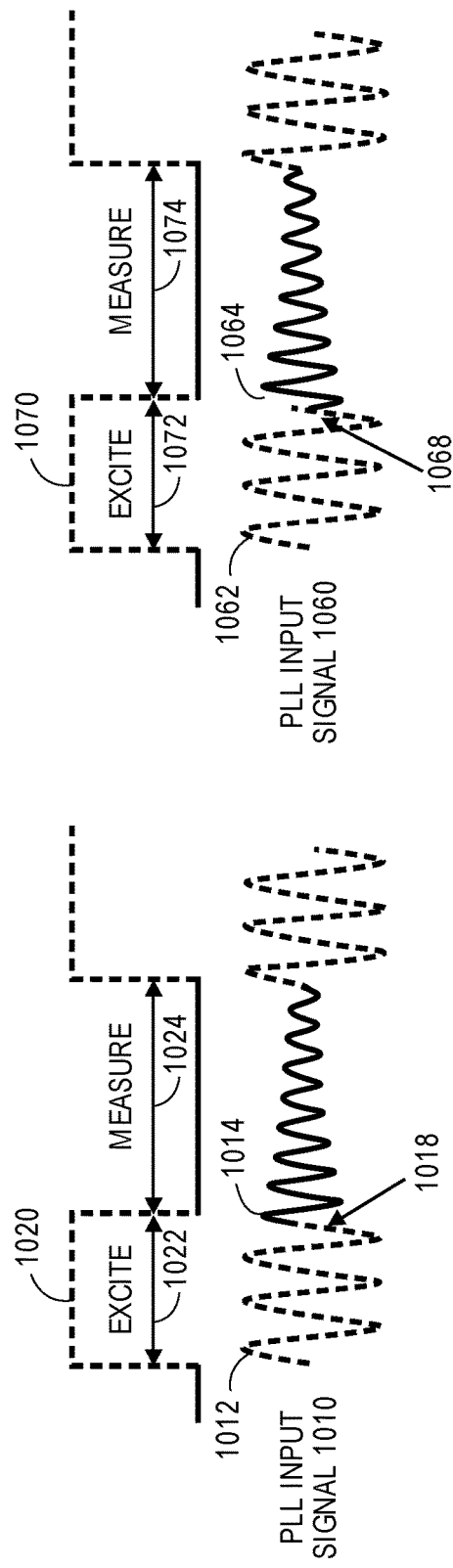
FIG. 10A
FIG. 10B

SWITCHED CLOSED LOOP READ-OUT METHODS AND SYSTEMS FOR RESONANT SENSING PLATFORMS

FIELD OF THE INVENTION

Embodiments of the present invention relate generally to the manufacture of semiconductor devices. In particular, embodiments of the present invention relate to switched closed loop read-out methods and systems for package integrated resonant sensing devices and platforms.

BACKGROUND OF THE INVENTION

A variety of different types of sensors are being used in portable and mobile devices. These sensors extend beyond microphones and radio receivers to accelerometers, gyroscopes, compasses, altimeters, barometers and more. One type of accelerometer includes beams coupled or attached to a proof mass at one end and anchored to vias that provide electrical connections at the other end. The beams and proof mass are released and thus free to move up and down in a vertical direction. The beams remain anchored to the vias. In one example, a permanent magnet is used to provide magnetic fields. To operate the device, an AC current is used to drive a moveable portion of each beam into mechanical resonance under the influence of the magnetic field. A conventional approach to extract the sense signal accurately, if the drive and sense signals are coupled, is to utilize a cancellation technique by providing the exact amount of the drive signal (calibration signal, drive voltage e.g., IR (drive current times sensor resistance)) at the input of a differential low-noise amplifier (summing amplifier configuration). As an example, the drive voltage (V=I*R), which will be referred to as "IR", and the sense signal (emf) have 1 mV and 10-15 µV peak-peak amplitudes, respectively. Therefore, the cancellation technique needs to be at least 0.1% accurate, for the cancellation error to be 20 dB less than the sense signal amplitude. However, any small amplitude and phase mismatch (of >0.1%) would suffice to render the cancellation technique inaccurate. Moreover, the fact that the primary driving signal is a current and the calibration signal is a voltage (V=IR, where R is the beam or sensor resistance) gives an additional mismatch parameter, since the sensor resistance is unknown and due to fabrication tolerances varies up to 30%. This large amount of tolerance does not allow the use of dummy sensor structures in order to turn a calibration current into the needed calibration voltage. Therefore, elaborate mixed-signal circuits are employed in order to overcome these drawbacks. First, a digital circuit is needed to successively approximate the resistance of the sensor R and store its digital value. Then, a variable gain amplifier adapts its gain (according to the stored R) and supplies the calibration voltage. Thus, extra design care has to be taken to keep the phase shift extremely small at the frequency of interest between drive and calibration signal. Moreover, low-noise temperature-stabilized voltage references have to be shared among all circuit components to achieve a good cancellation. Hence, in order to overcome these issues both digital and analog blocks are needed, increasing the size and power of the readout interface circuit.

BRIEF DESCRIPTION OF THE DRAWINGS

FIG. 1a, a top view of a sensing device 100 is shown, according to an embodiment.

FIG. 1b illustrates a top view of a sensing device 150 upon application of external acceleration, according to an embodiment.

FIG. 7 shows an implementation of a signal conditioning interface circuitry 700 in accordance with one embodiment.

FIGS. 8a and 8b illustrates frequency detection blocks that can be implemented utilizing different techniques in an analog or digital domain in accordance with certain embodiments.

FIG. 9 illustrates a phase locked loop (PLL) that is switched in a time domain in accordance with one embodiment.

FIG. 10A illustrates waveforms showing the benefit of PLL synchronous switching in comparison to waveforms of asynchronous PLL switching as illustrated in FIG. 10B in accordance with one embodiment.

DETAILED DESCRIPTION OF THE INVENTION

Figure 2:
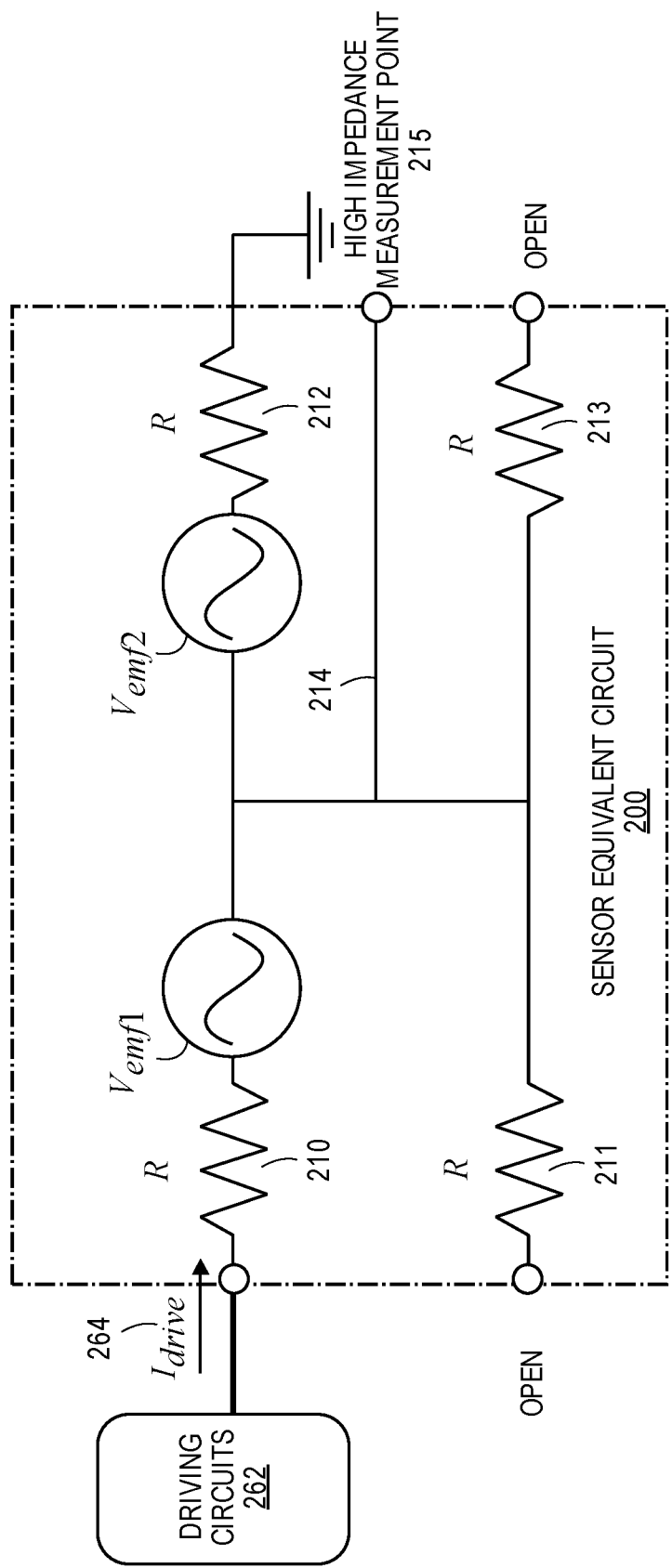
FIG. 2 illustrates a circuit equivalent for a sensing device (e.g., 100, 150) in accordance with one embodiment.

Described herein are switched closed loop read-out methods and systems for package integrated resonant sensing devices and platforms. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include a system level circuit architecture to efficiently decouple drive and sense signals in a package-integrated resonant sensor platform in order to enhance the sensor's resolution while remaining power efficient. The system level circuit architecture and methods for implementing closed loop read-out applies to any type of resonant sensor.

Referring now to FIG. 1a, a top view of a sensing device 100 is shown, according to an embodiment. In one example, the sensing device 100 is a package integrated resonant sensing device (e.g., accelerometer, pressure sensor, gyroscope, electromagnetic sensor, chemical species sensor, etc.). The sensing device 100 includes beams 110-113 coupled or attached to a proof mass 102 at one end and anchored to vias (e.g., drive vias 121-122, sense vias 123-124) that provide electrical connections at the other end. The beams and proof mass are released and thus free to move up and down in a vertical Y direction of FIG. 1a. The beams remain anchored to the vias. In one example, a permanent magnet is used to provide magnetic fields 140 and 141. To operate the device, an AC current at a frequency close or at $f_0$ is used to drive a moveable portion of each beam into mechanical resonance under the influence of the magnetic field. This AC drive current will be referred to as "drive signal." The beam then generates its own induced emf 117 and 118 (e.g., at beams 112, 113) at the same resonant frequency $f_0$ due to motion in the magnetic field.

FIG. 1b illustrates a top view of a sensing device 150 upon application of external acceleration, according to an embodiment. When an external acceleration 130 is applied, the proof mass 102 is displaced, inducing tension in the beam which changes the beam's resonant frequency. By measuring the emf signal (e.g., induced emf 131, 132 at $f_1$) which will be referred to as a "sense signal", the change in resonant frequency and hence the applied acceleration can be determined. In one example, drive signals applied to the beams through the drive vias cause the beams to resonate at a first frequency and generate an induced emf at the first frequency. An applied acceleration 130 can cause tension in the beams which changes the resonant frequency of the beams to a second frequency. Note, in this sensor platform there is no capacitive readout, but rather a voltage measurement (of the emf) over a resistive beam.

FIG. 2 illustrates a circuit equivalent for a sensing device (e.g., 100, 150) in accordance with one embodiment. The sensor equivalent circuit 200 includes the resistive beams 210-213 and one beam 214 connected to a high impedance measurement point 215 in this example. The driving circuits 262 supply the AC drive signal I, which is $I_{drive}$ 264 in FIG. 2. In this example, $I_{drive}$ 264 flows from the upper left beam 210 thru the right upper beam 212 to the ground. Both upper left beam 210 and upper right beam 212 will start mechanically oscillating as described above and an emf (e.g., $V_{emf1}$ over the beam 210, $V_{emf2}$ over the beam 212) will be generated. Beams 211 and 214 do not contribute to any emf generation since no AC current flows thru them.

A prior approach uses the same resonant trace for supplying the driving signal and sensing the induced emf. However, the problem with this approach is that at resonance the driving voltage (e.g., IR (drive current times resistance)) and the induced emf (signal to be measured) are superimposed on each other along the beam. Moreover, at resonance the driving voltage and the induced emf are in phase, which means the magnitudes of both signals are added on top of each other.

For a representative design, the generated emf is on the order of 10-15 microvolts (µV) and the voltage that arises from the drive current is on the order of 1-5 millivolts (mV) prior to any amplification. To be able to accurately capture changes in the emf and correlate them to changes in resonant frequency and hence applied acceleration, the driving IR signal thus needs to be controlled to less than 0.1%, to guarantee that any changes in the total signal are coming from changes in the emf only. This is challenging due to fabrication tolerances which produce large variations in the value of resistance R of the beams (e.g., up to 30% variation) in addition to noise-induced fluctuations in the value of current. Therefore, this prior approach requires very involved circuitry with state of the art components such as low-noise amplifiers and potentially high power consumption. Additionally, the prior approach would require very precise fabrication process control, which increases the cost of manufacturing and presents an obstacle for successfully implementing those sensors.

The present design includes a novel circuit architecture in digital and analog domains to decouple the drive and sense signals by using time division techniques, thereby alleviating the strict requirements above, which would otherwise be required when the signals are coupled/superimposed.

Figure 3:
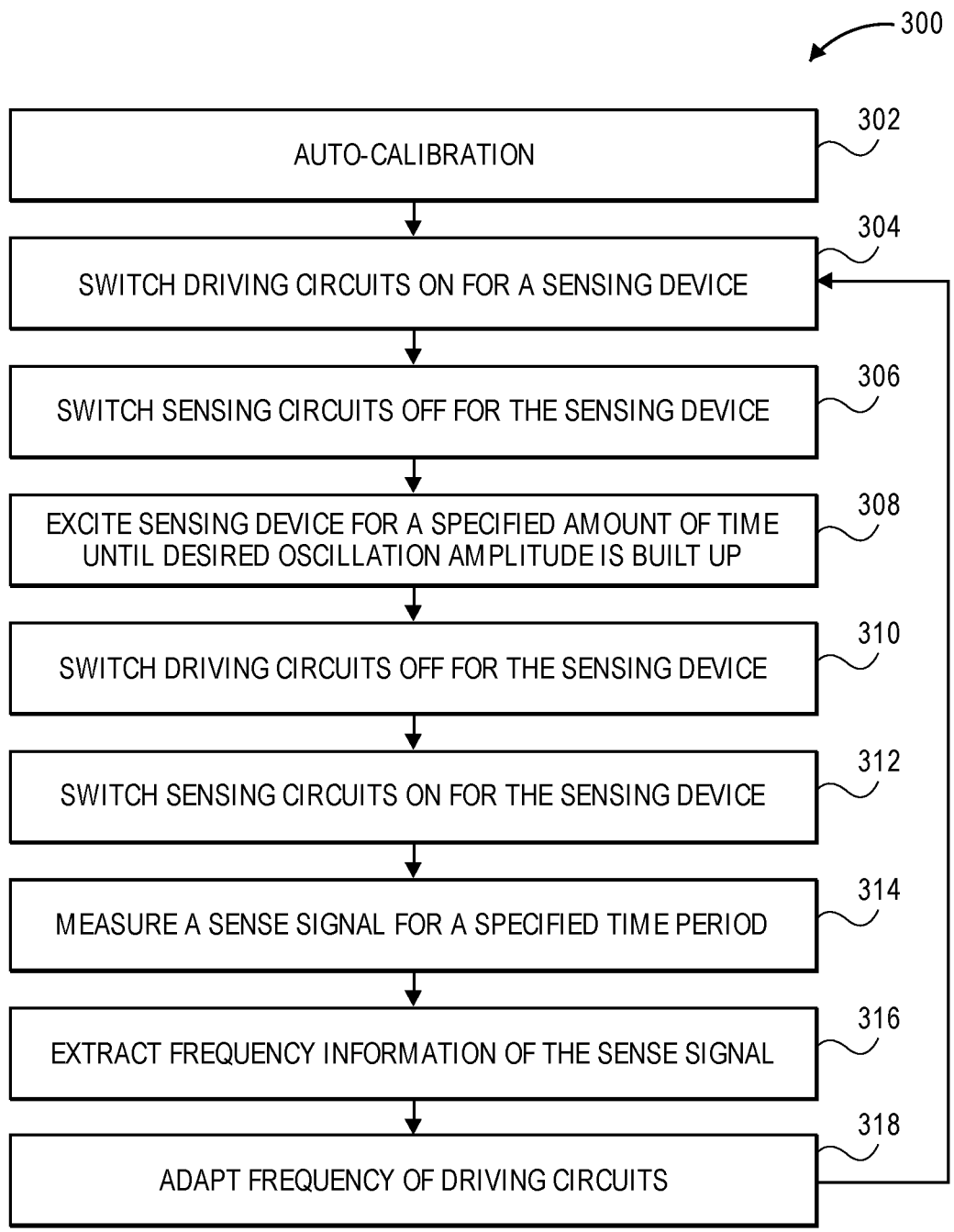
FIG. 3 illustrates a flow diagram for a method 300 of operating a sensing device with separate drive and sense periods.

Instead of supplying the drive signal I continuously while sensing the induced emf, the present design separates drive and sense periods. FIG. 3 illustrates a flow diagram for a method 300 of operating a sensing device with separate drive and sense periods. The operations of method 300 may be performed with processing logic of a system architecture of a microelectronic device or computing device. The processing logic may comprise hardware (e.g., circuitry, digital circuitry 602, digital circuitry 603, dedicated logic, programmable logic, microcode, etc.), software (such as instructions run on a processing device), or a combination thereof.

At operation 302, processing logic initiates the read-out method 300 and optionally performs auto-calibration of the system architecture. At operation 304, the processing logic switches driving circuits to an ON enabled state for a sensing device (e.g., driving circuits are coupled to the sensing device). At operation 306, the processing logic switches sensing circuits (e.g., signal conditioning circuitry, frequency detection) to a disabled OFF state (or hold state) for the sensing device (e.g., sensing circuits are decoupled from the sensing device). At operation 308, during a drive period, a drive signal is supplied to the sensing device for a certain amount of time (e.g., excitation period) until sufficient amplitude of mechanical oscillation has built up in the suspended beams of the sensing device. The drive signal frequency is close to but, doesn't exactly match, the resonant frequency of the sensing device, which is the parameter to be extracted.

Figure 4:
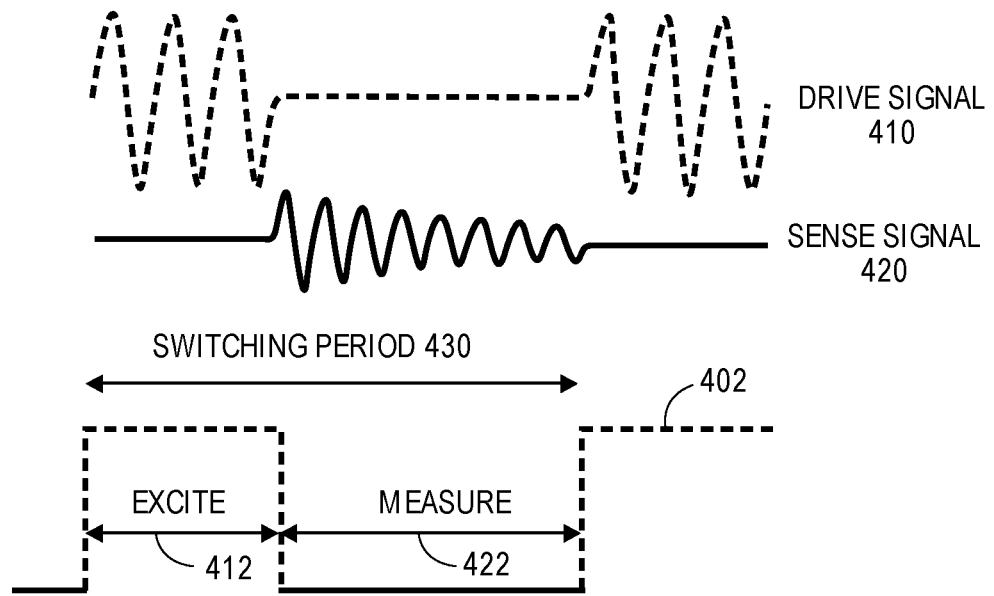
FIG. 4 illustrates a switching waveform 402 having an excitation period 412 for applying a drive signal 410 and a measure period 422 for measuring a sense signal 420.

FIG. 4 illustrates a switching waveform 402 having an excitation period 412 for applying a drive signal 410 and a measure period 422 for sensing a sense signal 420. A switching period 430 includes one excitation period 412 and one measure period 422. The drive signal is switched to an OFF disabled (decoupled from the sensing device) during measurement time so that the sense signal comprises of only the emf with exponentially decaying amplitude.

Referring to FIG. 3, at operation 310, the processing logic switches driving circuits to an OFF disabled state for the sensing device (e.g., driving circuits are decoupled from the sensing device). At operation 312, the processing logic switches sensing circuits to an ON enabled state for the sensing device (e.g., sensing circuits are coupled to the sensing device). Thus, the drive signal is switched off and the sense or measurement period is initiated at operations 310 and 312. During this sense period (e.g., measure period 422), no external energy is being supplied to the system architecture and hence the mechanical oscillation of the beams, and thus the generated emf, start decaying in amplitude. However, the frequency of the emf voltage now moves closer to the natural frequency of the beams (rather than matching the drive signal frequency as it did in the drive period). During this decaying oscillation period, the sense signal (emf) is measured at operation 314 and a frequency of the sense signal is extracted at operation 316. Since the drive signal I is switched to an OFF disabled state, there is no IR signal superimposed on the sense signal. Once the oscillations decay sufficiently to be difficult to measure (e.g., decaying oscillations have become too small in magnitude to be measured accurately which occurs at approximately 300 oscillation cycles), the next drive period is started, and the new drive signal frequency is adjusted to match the extracted frequency during the sense period in the previous cycle at operation 318. This feedback cycle is repeated as the method 300 returns to operation 304 until the drive and extracted signal frequencies match, at which point the sensing device is mechanically oscillating at its natural resonant frequency.

When excitation and measurement periods are decoupled as shown in FIG. 4, the additional circuit components of the conventional cancellation technique are no longer needed. Since the voltage arising from the drive current (IR voltage) is now decoupled from the sense signal (emf), in one example, an interface circuit merely comprises of a low-noise amplifier and hence all additional mixed-signal circuit calibration techniques can be safely omitted. Here, it is worth noting that apart from reading out the sense signal accurately, the circuitry has to run in a closed loop manner (see for example FIGS. 5 and 6), where the detected frequency of the sensed signal affects (and sets) the frequency of the driving signal. This means that any closed loop system solution has to be able to respond within a few milliseconds or less in order to achieve a 30 Hz or better real-time sensor operation. As will be shown below, the present design is capable of delivering such response times.

Figure 5:
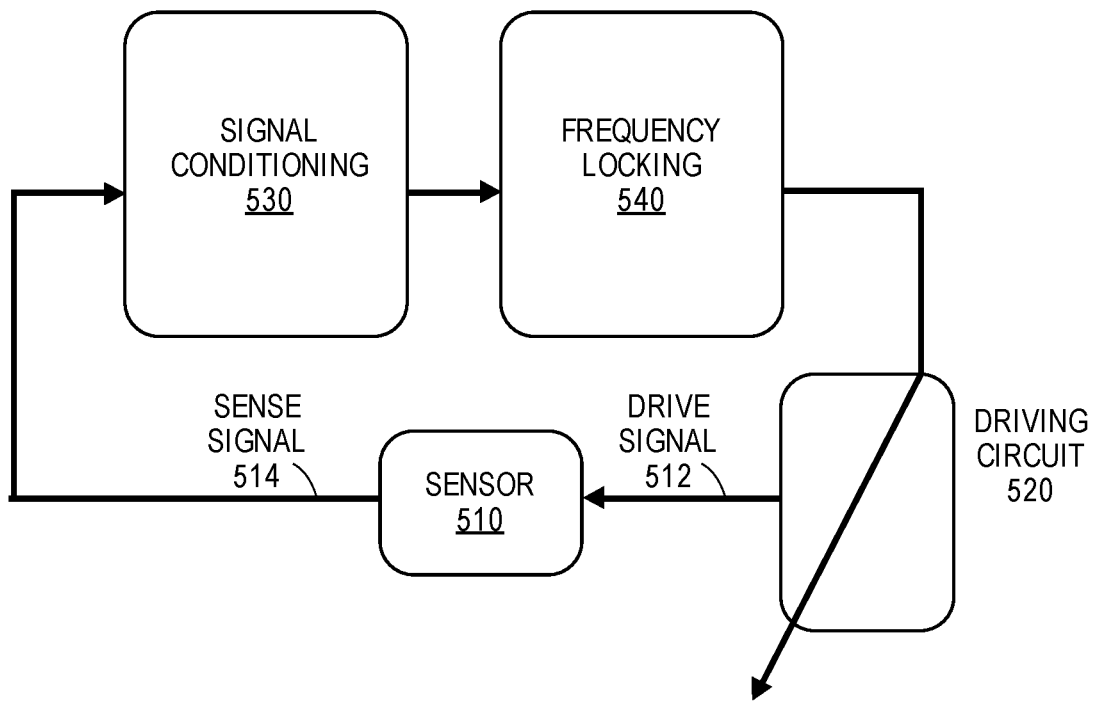
FIG. 5 illustrates a block diagram of a system architecture 500 of a sensing device in a closed loop operation in accordance with one embodiment.

FIG. 5 illustrates a block diagram of a system architecture 500 of a sensing device in a closed loop operation in accordance with one embodiment. The system architecture 500 includes a sensing device 510 (e.g., sensor 510) that receives a drive signal 512 from driving circuitry 520 during an excitation period and then during a different measurement period a sense signal 514 is sensed and provided to signal conditioning unit 530 (e.g., amplifiers, filters, etc.) which conditions these signals. The frequency locking unit 540 (e.g., phase locked loop (PLL)) receives the conditioned signals and generates a signal close or at the extracted frequency of the conditioned sensed signal. The extracted frequency is used to influence an adjustable frequency of the driving signal as set by the driving circuitry 520. In other words, a new drive signal frequency is adjusted to match the extracted frequency of the conditioned sense signal during the sense period in a previous cycle.

The novelty in this system architecture lies in the fact that drive and sense signals are decoupled by a time division technique. For that reason the present design switches between the driving and sensing blocks of the circuit by the use of switching logic (e.g., CMOS-based switching logic, switches) as shown in FIG. 6.

Figure 6:
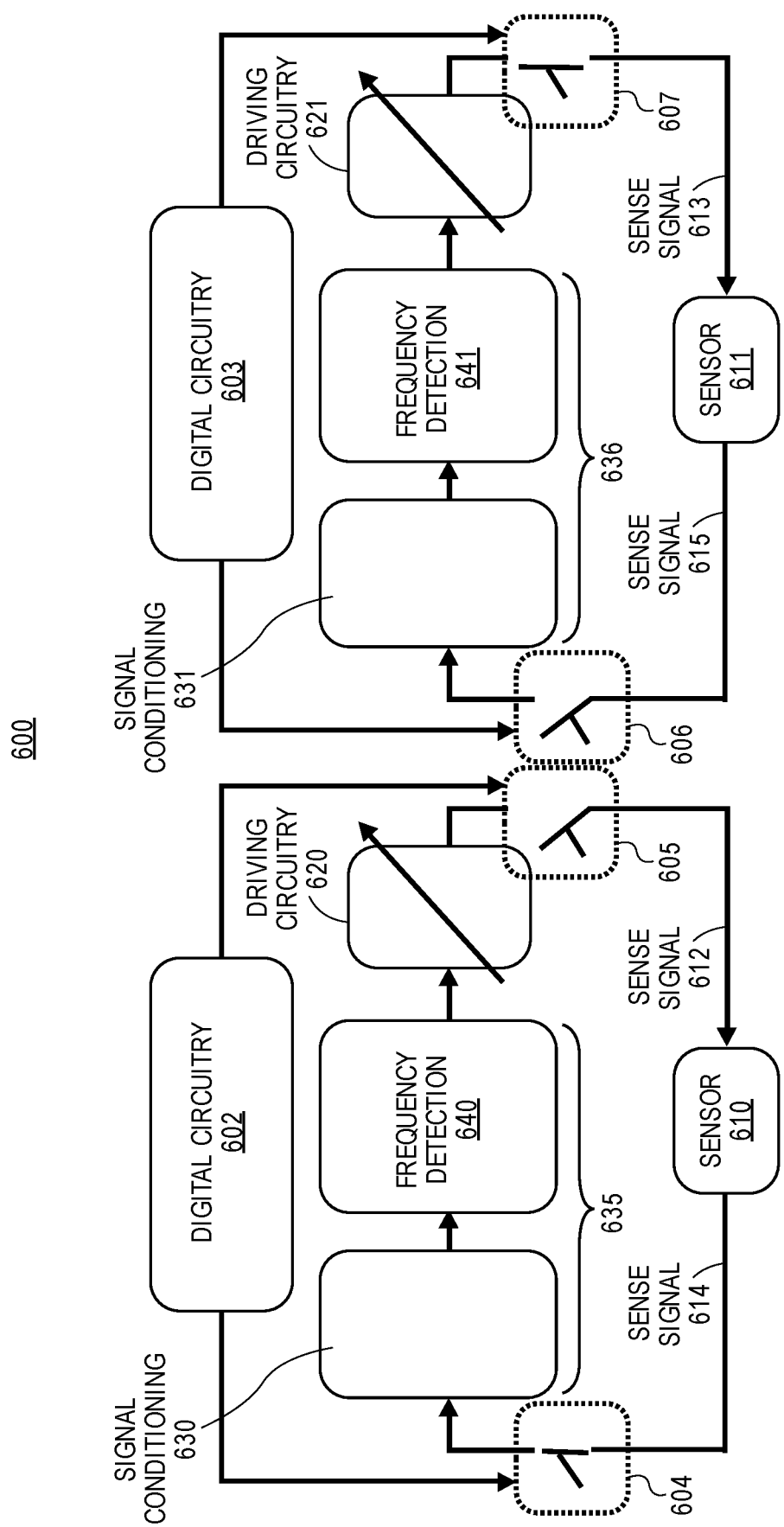
FIG. 6 illustrates a block diagram of a sensing device (e.g., sensor) in a closed loop operation with our present system architecture 600 in accordance with one embodiment.

FIG. 6 illustrates a block diagram of a sensing device (e.g., sensor) in a closed loop operation with our present system architecture 600 in accordance with one embodiment. The added switches 604-605 and 606-607 are operated by the digital circuitry (e.g., control circuitry) 602 and 603, respectively, to switch on/off the driving and sensing blocks (e.g., circuitry 620-621, signal conditioning 630-631) of the system according to the current operation period (excitation or measurement period). The digital circuitry may control a state of the frequency detection 640, 641 as well. The digital circuitry may control a state of the signal conditioning circuitry 630, 631 or may control a state of the driving circuitry 620, 621 as well. The switching logic 604 and 606 are closed during a measurement sensing period and switching logic 605 and 607 are closed during an excitation period. The digital circuitry 602 and 603 also performs calibration, start-up operations, programming, and timing operations (e.g., operations of method 300) and may be coupled or include a memory.

In this present disclosure, different embodiments of the detailed structure of the blocks in FIG. 6 will be provided, however the blocks are not limited to only those discussed herein. Starting from the signal conditioning blocks 630-631, these blocks may contain amplifying circuits to increase the amplitude of the sensed emf signals and filters to reduce the frequency spectrum of the sensed data. Such amplifiers might include an amplifier chain, with for example the first amplifier to serve as a very low noise stage (e.g., less than 5 nV/sqrt(Hz)) while the rest of the amplifiers to offer additional amplification and bandwidth limitation. In one example, the filters may be very narrowband since a natural frequency of the mechanical sensing device is known prior to this read out method under different levels of acceleration (e.g., when the sensor is an accelerometer) or in general under different levels of the quantity to be sensed. The filters may also be programmable (e.g., filters based on switched-capacitor (SC) technology).

FIG. 7 shows a potential implementation of signal conditioning interface circuitry 700 in accordance with one embodiment. The signal conditioning interface circuitry 700 receives input signal 702 and generates output signal 704. The circuitry 700 includes a two-stage amplifying chain 710, followed by filter block 720 that includes a high-pass filter 722 and a programmable bandpass filter 724 tunable with an externally providing $f_{elk}$ signal. In one example, a potential implementation of a signal conditioning interface circuitry 700 includes an amplifier G1 that might be a low noise amplifier while G2 might be a high-gain amplifier. The following filters may be a combination of several filtering blocks.

FIGS. 8a and 8b illustrates frequency detection blocks that can be implemented utilizing different techniques in an analog or digital domain in accordance with certain embodiments. For example, FFT analysis on a signal of a frequency detection block can be used to extract a frequency content of the signal as illustrated in FIG. 8a. The frequency detection circuitry 800 includes an analog to digital converter (ADC) 810 and a digital core 820 that performs frequency extraction using FFT techniques. The FFT calculations are performed by the digital core 820 after converting an incoming conditioned signal 802 into the digital domain using the ADC 810. However, these FFT techniques might require extra computation time that might affect the total response of the system architecture. The circuitry 850 represents another design that includes a comparator 860 and digital counting circuitry 870. This circuitry 850 extracts a frequency of an input signal by "counting" its zero crossings within a pre-defined time period after "squaring" an input conditioned waveform 852 (e.g., sinusoidal waveform) using a comparator 860.

Although the above-mentioned frequency detection techniques take place in the digital domain, there are analog or mixed-signal counterparts covered in the following embodiment. While digital domain architectures can easily incorporate the duty cycling or delays between the current sensing period and the next sensing period, in the analog domain this has to be performed by utilizing some switch and hold techniques. Therefore, the introduction of a phase locked loop (PLL) that is switched in a time domain is shown in FIG. 9 in accordance with one embodiment. This switched PLL circuitry 900 includes input circuitry 910 (e.g., switching logic, switches) including inputs 902 and 903, circuitry 920 having a phase-frequency detector 921 (PFD), a charge pump 922 (CP), and a loop filter 923 (LF). The circuitry 920 is coupled to a voltage controlled oscillator 930 (VCO). The PLL circuitry 900 is a control system that generates an output signal 904 having a phase that is related to a phase of an input signal 902. The VCO generates a periodic signal and output from the VCO is fed back with feedback loop 940 for comparison of inputs 902 and 903. The feedback from the VCO becomes input 903 that is designed to match a phase and frequency of the input 902.

Since the present design provides duty cycling of the excitation and measurement times, the PLL circuitry 900 is needed to lock into a sensed signal frequency only during the measurement time period (sense time period), while being on hold during the excitation time period. The present design may not completely switch off the PLL circuitry 900 and lose locking, in order to have a faster tracking in the next/following measurement cycle. This would enhance the response time of the closed loop system. Therefore, the present design switches the PLL circuitry 900 into a "hold state", where the input signal 901 (e.g., conditioned sense signal) is not sampled but its output 904 remains locked to the previous state since the input circuitry 910 (e.g., switch) shorts the two PLL inputs 902 and 903. Another way of implementing the proposed hold state would be to implement the switching either at the PFD, CP or LF level.

Another important circuit technique proposed in the present design includes having the signals (e.g., control signals from digital circuitry 602, 603) which operate the switches being derived directly from the output 904 of the PLL circuitry, which is continuously running, to ensure a synchronous operation and avoid any large phase jumps at the input of the PLL circuitry while transitioning from an excitation to a measurement cycle. Large phase jumps would lead to the loss of the locking and tracking state of the PLL circuitry, which translates into larger response times.

FIG. 10A illustrates waveforms showing the benefit of PLL synchronous switching in comparison to waveforms of asynchronous PLL switching as illustrated in FIG. 10B in accordance with one embodiment. FIG. 10A illustrates VCO synchronous switching 1000 in which a switching waveform 1020 switches from an excitation period 1022 to a measurement period 1024. A PLL input signal 1010 switches from a driving signal 1012 to a sensed measurement signal 1014 with no significant phase jump at a switching time 1018. Simulations show that locking times of less than 1 millisecond (ms) can be achieved.

In contrast, FIG. 10B illustrates PLL asynchronous switching 1050 in which a switching waveform 1070 switches from an excitation period 1072 to a measurement period 1074. A PLL input signal 1060 switches from a driving signal 1062 to a sensed measurement signal 1064 with a significant phase jump having a sharp discontinuity at a switching time 1068.

Figure 11:
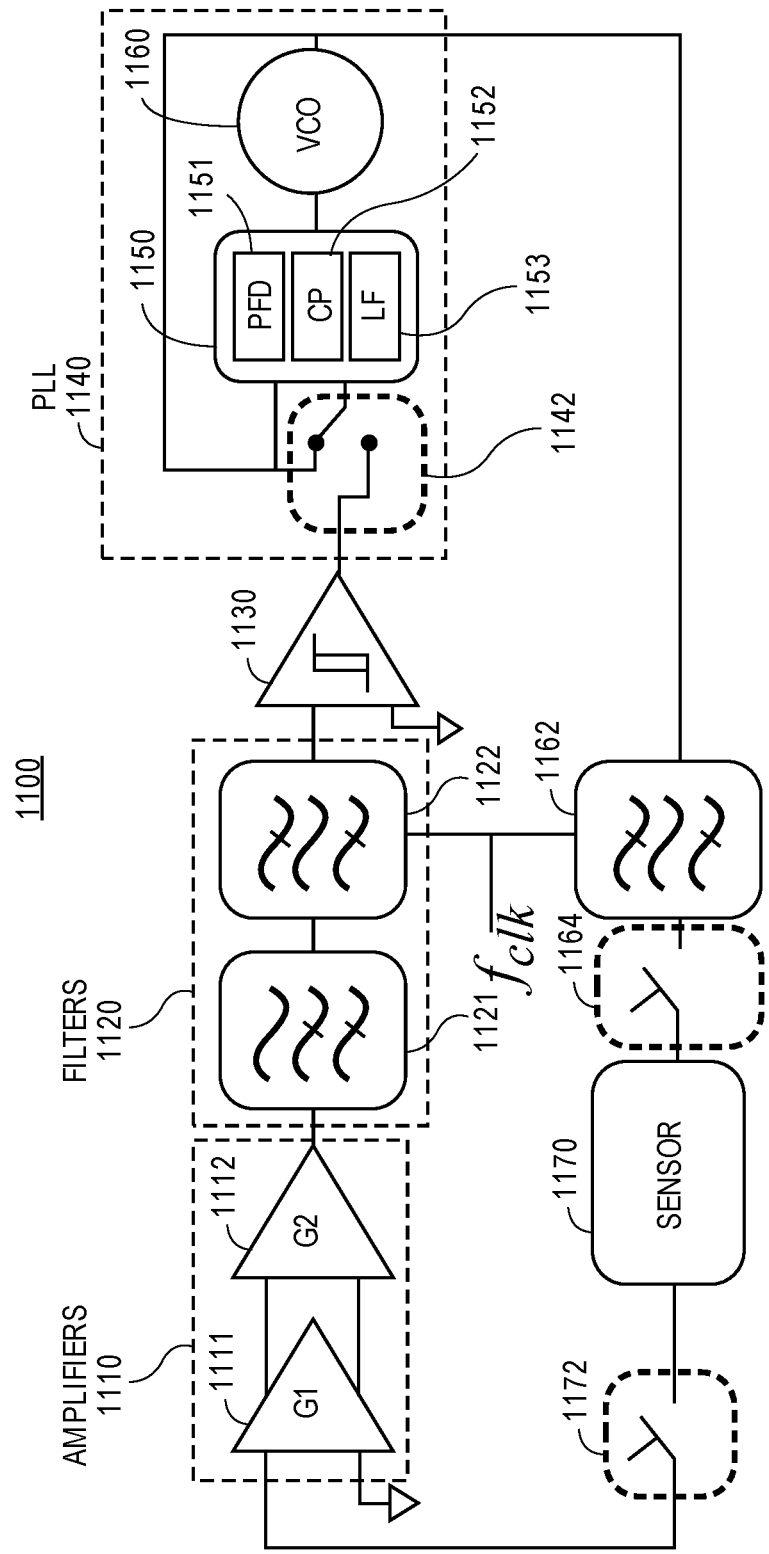
FIG. 11 illustrates a full closed loop system with an analog intense implementation in accordance with one embodiment

Additionally, there are several ways to implement the driving circuitry shown in FIG. 6. This driving circuitry (e.g., driving circuitry 620-621) can include digital to analog converters, additional filtering blocks, and amplifiers. A full closed loop system with an analog intense implementation is shown in FIG. 11 in accordance with one embodiment. The system 1100 includes a sensor 1170 for receiving drive signals and generating sense signals, amplifiers 1110 (e.g., amplifiers 1111, 1112) to amplify sensed signals, filters 1120 (e.g., filters 1121, 1122) to filter the amplified sensed signals, a comparator 1130 for comparing an output signal of the filters 1120 with a reference signal, and PLL circuitry 1140. The PLL circuitry 1140 includes switch 1142, circuitry 1150 with PFD 1151, CP 1152, and LF 1153, and VCO 1160. A filter 1162 receives an output signal (e.g., drive signal) from the PLL 1140. A switch 1164 couples the filter 1162 to a sensor 1170 and a switch 1172 couples the sensor 1170 to the amplifiers 1110.

Figure 12:
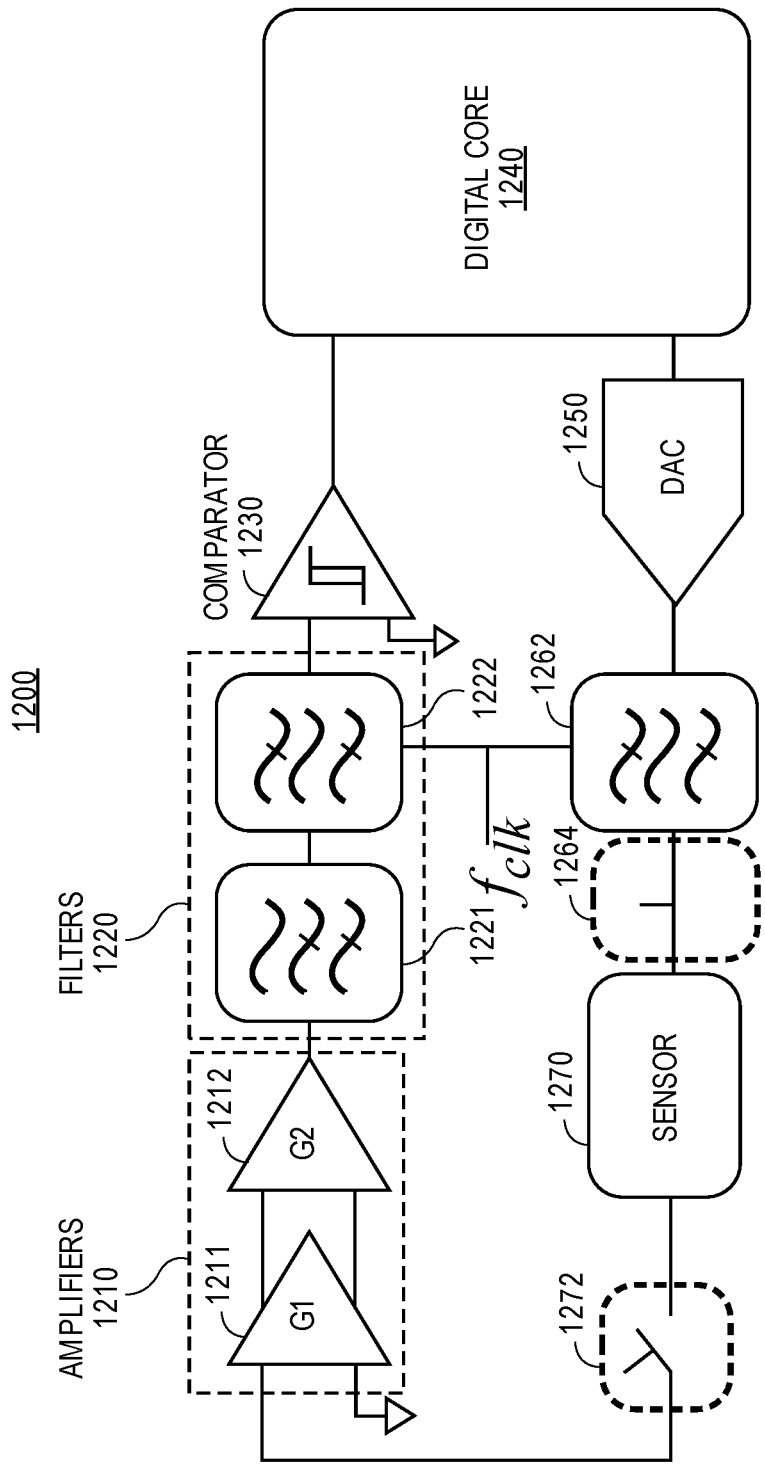
FIG. 12 illustrates a full closed loop system with digital intense implementation in accordance with one embodiment.

A full closed loop system with digital intense implementation is shown in FIG. 12 in accordance with one embodiment. The system 1200 includes a sensor 1270 for receiving drive signals and generating sense signals, amplifiers 1210 (e.g., amplifiers 1211, 1212) to amplify sensed signals, filters 1220 (e.g., filters 1221, 1222) to filter the amplified sensed signals, a comparator 1230 for comparing an output signal of the filters 1220 with a reference signal, and digital core 1240 that performs frequency extraction of input signals and driving signal generation for the sensor 1270. A digital to analog converter 1250 converts digital signals from the digital core 120 into analog signals which are filtered by filter 1262. A switch 1264 couples the filter 1262 to a sensor 1270 and a switch 1272 couples the sensor 1270 to the amplifiers 1210.

Figure 13:
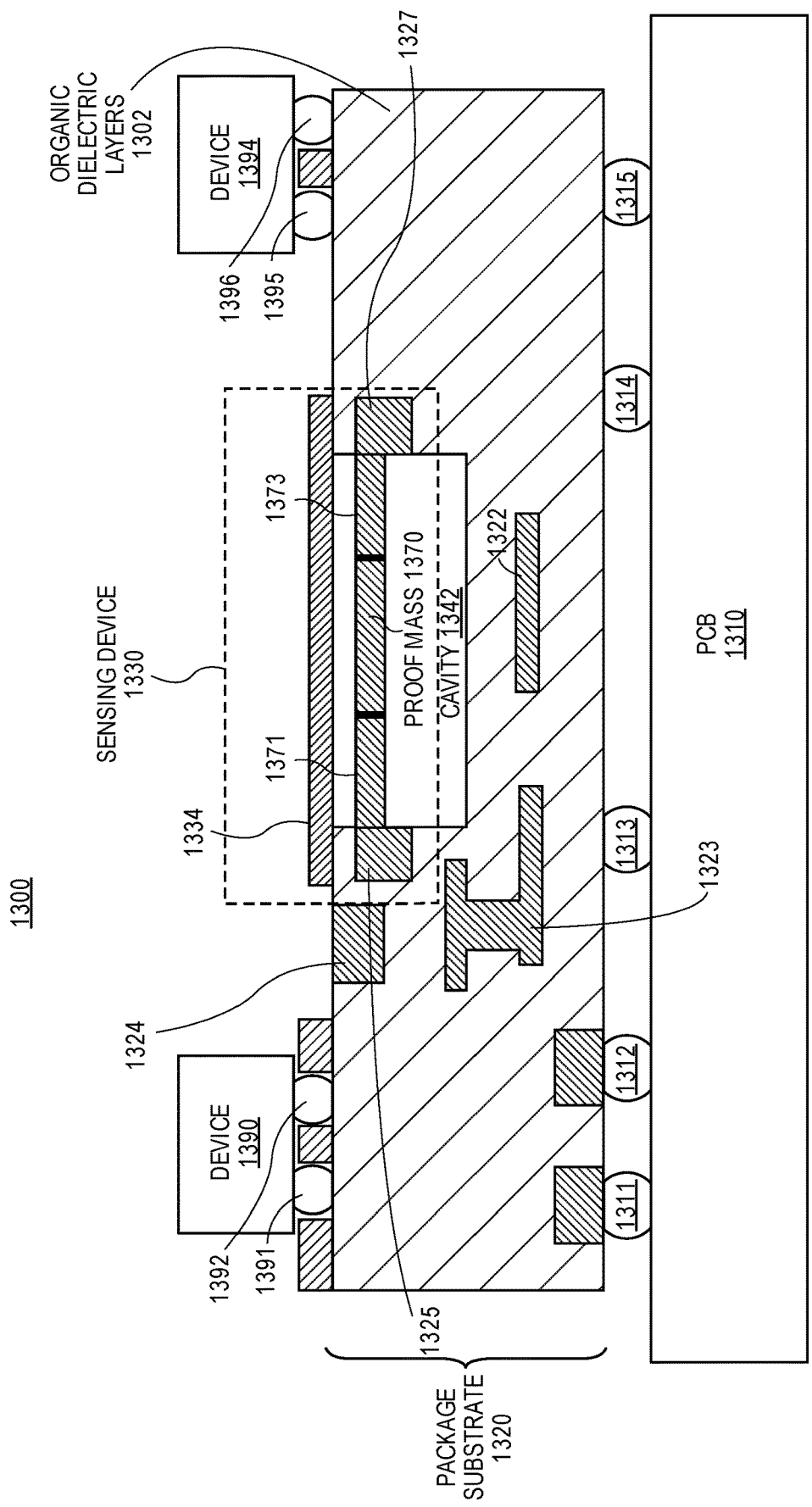
FIG. 13 illustrates a view of a microelectronic device 1300 having package-integrated resonant sensing devices according to an embodiment.

Referring now to FIG. 13, a view of a microelectronic device 1300 having package-integrated resonant sensing devices is shown, according to an embodiment. In one example, the microelectronic device 1300 includes multiple devices 1390 and 1394 (e.g., die, chip, CPU, silicon die or chip, radio transceiver, resonant sensing system, etc.) that are coupled or attached to a package substrate 1320 with solder balls 1391-1392, 1395-1396. The package substrate 1320 is coupled or attached to the printed circuit board (PCB) 1310 using, for example, solder balls 1311 through 1315.

The package substrate 1320 (e.g., organic substrate) includes organic dielectric layers 1302 and conductive layers 1322-1325,1327, 1370, 1371, and 1373. Organic materials may include any type of organic material such as flame retardant 4 (FR4), resin-filled polymers, prepreg (e.g., pre impregnated, fiber weave impregnated with a resin bonding agent), polymers, silica-filled polymers, etc. The package substrate 1320 can be formed during package substrate processing (e.g., at panel level). The panels formed can be large (e.g., having in-plane (x, y) dimensions of approximately 0.5 meter by 0.5 meter, or greater than 0.5 meter, etc.) for lower cost. A cavity 1342 is formed within the packaging substrate 1320 by removing one or more layers (e.g., organic layers, dielectric layers, etc.) from the packaging substrate 1320. In one example, a sensing device 1330 (e.g., sensor, accelerometer) is formed with proof mass 1370, conductive structures 1371 and 1373 (e.g., beams, traces), conductive structures 1325 and 1327 (e.g., vias/anchors), and additional conductive structures (e.g., beams, traces, vias, pads) that are not shown in this cross-sectional view. Optionally an integrated magnet 1334 or an external magnet is also included in the sensing device 1330. The cavity 1342 can be air filled or vacuum filled.

A device (e.g., die 1390, 1394) is optionally assembled proximate the magnet. This device may include the control circuitry (e.g., digital circuitry, driving circuitry, signal conditioning, frequency detection, and/or other related circuitry) for controlling and interrogating the sensing device 1330. As will be appreciated, the device 1390 or 1394 may include all or none of these circuits, and may include other circuits for performing other functions.

It will be appreciated that, in a system on a chip embodiment, the device (e.g., die) may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more sensing devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 14:
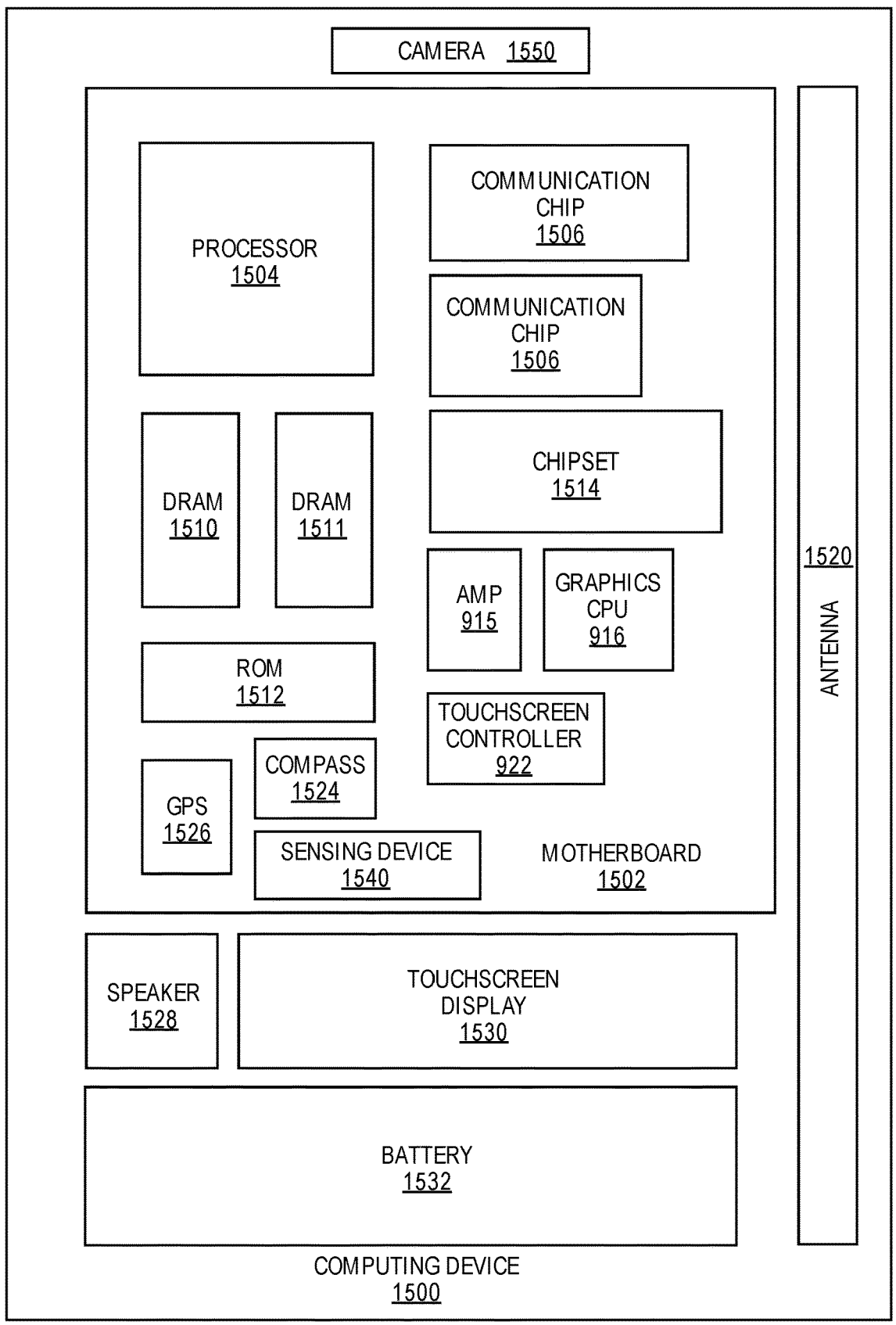
FIG. 14 illustrates a computing device 1500 in accordance with one embodiment of the invention.

FIG. 14 illustrates a computing device 1500 in accordance with one embodiment of the invention. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504. The system architecture (e.g., 600, 1100, 1200) of the present design may be implemented in any components of the computing device 1500.

Depending on its applications, computing device 1500 may include other components that may or may not be physically and electrically coupled to the board 1502. These other components include, but are not limited to, volatile memory (e.g., DRAM 1510, 1511), non-volatile memory (e.g., ROM 1512), flash memory, a graphics processor 1516, a digital signal processor, a crypto processor, a chipset 1514, an antenna 1520, a display, a touchscreen display 1530, a touchscreen controller 1522, a battery 1532, an audio codec, a video codec, a power amplifier 1515, a global positioning system (GPS) device 1526, a compass 1524, a sensing device 1540 (e.g., a sensor, accelerometer, electromagnetic sensor, etc.), a gyroscope, a speaker, a camera 1550, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi, WiGig and Bluetooth and a second communication chip 1506 may be dedicated to longer range wireless communications such as GPS, EDGE, GPRS, CDMA, WiMAX, LTE, Ev-DO, 5G, and others.

The processor 1504 of the computing device 1500 includes an integrated circuit die packaged within the processor 1504. In some implementations of the invention, the integrated circuit processor package or motherboard 1502 includes one or more devices, such as sensing devices in accordance with implementations of embodiments of the invention. The term "processor" may refer to any device or portion of a device that processes electronic data from registers and/or memory to transform that electronic data into other electronic data that may be stored in registers and/or memory. The communication chip 1506 also includes an integrated circuit die packaged within the communication chip 1506. The following examples pertain to further embodiments. Example 1 is a resonant sensing system comprising driving circuitry to generate a drive signal during excitation time periods, a first switch coupled to the driving circuitry, a sensing device coupled to the driving circuitry via the first switch during the excitation time periods. The sensing device having beams receives the drive signal during a first excitation time period that causes the beams to mechanically oscillate and generates a first induced electromotive force (emf) in response to the drive signal. The first switch to decouple the sensing device and the driving circuitry during measurement time periods for measurement of the induced emf.

In example 2, the subject matter of example 1 can optionally include a second switch and a signal conditioning interface circuitry coupled to the sensing device via the second switch during the measurement time periods and decoupled from the sensing device during the excitation time periods. The signal conditioning interface circuitry receives a sense signal associated with the first induced emf during a first measurement time period and generates a conditioned sense signal that is amplified and filtered by the signal conditioning interface circuitry.

In example 3, the subject matter of any of examples 1-2 can optionally include frequency detection circuitry that is coupled to the signal conditioning interface circuitry. The frequency detection circuitry detects an extracted frequency of the conditioned sense signal during the first measurement time period.

In example 4, the subject matter of any of examples 1-3 can optionally include the frequency detection circuitry provides the extracted frequency of the conditioned sense signal during the first measurement time period to the driving circuitry and this causes an adjustment of a frequency of the drive signal for a second excitation time period.

In example 5, the subject matter of any of examples 1-4 can optionally include the driving circuitry sending the drive signal having the adjusted frequency to the sensing device during the second excitation time period and this drive signal causes the beams of the sensing device to mechanically oscillate and generate a second induced electromotive force (emf) in response to the drive signal.

In example 6, the subject matter of any of examples 1-5 can optionally include the signal conditioning interface circuitry to receive a sense signal associated with the second induced emf during a second measurement time period.

In example 7, the subject matter of any of examples 1-6 can optionally include digital circuitry to control switching of the first and second switches between excitation and measurement periods until an extracted frequency of the conditioned sense signal matches a frequency of the drive signal and this causes the sensing device to be mechanically oscillating at a natural resonant frequency of the sensing device.

In example 8, the subject matter of any of examples 1-7 can optionally include the frequency detection circuitry comprising a digital core to perform frequency extraction utilizing fast fourier transform techniques.

In example 9, the subject matter of any of examples 1-8 can optionally include the frequency detection circuitry comprising a comparator and a digital counting circuitry to extract a frequency of the conditioned sense signal by counting a number of zero crossings within a pre-defined time period.

In example 10, the subject matter of any of examples 1-9 can optionally include the sensing device includes the beams and a mass each being a conductive portion of a package-integrated resonant accelerometer which is fabricated using panel level processing.

Example 11 is a closed loop system comprising a sensor for receiving drive signals during excitation time periods and generating sense signals during measurement time periods. Signal conditioning circuitry is coupled to the sensor during the measurement time periods. The signal conditioning circuitry to condition sensed signals and phase locked loop (PLL) circuitry that is coupled to the signal conditioning circuitry. The PLL circuitry is switched in a time domain between first and second states with input circuitry of the PLL circuitry to sample conditioned sense signals during the measurement time periods to lock into a frequency of conditioned sensed signals during the first state.

In example 12, the subject matter of example 11 can optionally include the input circuitry of the PLL circuitry holding without sampling the conditioned sense signals during the excitation time periods during the second state and an output circuitry of the PLL circuitry remaining locked to a previous state.

In example 13, the subject matter of any of examples 11-12 can optionally include the input circuitry comprises switching logic that switches the PLL circuitry between the first and second states.

In example 14, the subject matter of any of examples 11-13 can optionally include the PLL circuitry, which includes phase-frequency detector circuitry, charge pump circuitry coupled to the phase-frequency detector circuitry, loop filter circuitry coupled to the charge pump circuitry, and a voltage-controlled oscillator (VCO) coupled to the loop filter circuitry. The phase-frequency detector circuitry compares an input conditioned sensed signal to an output signal of the VCO.

In example 15, the subject matter of any of examples 11-14 can optionally include control circuitry coupled to the switch logic. The control circuitry controls the switching logic and receives a reference signal that is derived directly from the output signal of the VCO, which is continuously running, to ensure a synchronous operation and avoid phase jumps at the input circuitry of the PLL circuitry while transitioning from an excitation period to a measurement period.

Example 16 is a read-out method for operating a sensing device comprising switching, with processing logic, driving circuits to an enabled state for a sensing device by coupling the driving circuits to the sensing device. The method further includes switching, with the processing logic, sensing circuits to a disabled state for the sensing device by decoupling sensing circuits from the sensing device and during a drive period, supplying a drive signal to the sensing device for an excitation period to cause mechanical oscillations of suspended beams of the sensing device.

In example 17, the subject matter of example 16 can optionally include switching driving circuits to a disabled state for the sensing device by decoupling driving circuits from the sensing device and switching sensing circuits to an enabled state for the sensing device by coupling sensing circuits to the sensing device.

In example 18, the subject matter of any of examples 16-17 can optionally include during a measurement period, measuring a sense signal that indicates an induced emf of the beams of the sensing device.

In example 19, the subject matter of any of examples 16-18 can optionally include extracting a frequency of the sense signal. In example 20, the subject matter of any of examples 16-19 can optionally include upon sufficient decay of oscillations of the beams, initiating a subsequent drive period with a new drive signal frequency being adjusted to match the extracted frequency during the measurement period.

The invention claimed is:

1. A resonant sensing system comprising:
   driving circuitry to generate a drive signal during excitation time periods;
   a first switch coupled to the driving circuitry;
   a sensing device coupled to the driving circuitry via the first switch during the excitation time periods, the sensing device having beams to receive the drive signal during a first excitation time period that causes the beams to mechanically oscillate and generates a first induced electromotive force (emf) in response to the drive signal, the first switch to decouple the sensing device and the driving circuitry during measurement time periods for measurement of the induced emf;

a second switch;

a signal conditioning interface circuitry coupled to the sensing device via the second switch during the measurement time periods and decoupled from the sensing device during the excitation time periods, the signal conditioning interface circuitry to receive a sense signal associated with the first induced emf during a first measurement time period and to generate a conditioned sense signal that is amplified and filtered by the signal conditioning interface circuitry; and frequency detection circuitry coupled to the signal conditioning interface circuitry, the frequency detection circuitry to detect an extracted frequency of the conditioned sense signal during the first measurement time period, wherein the frequency detection circuitry provides the extracted frequency of the conditioned sense signal during the first measurement time period to the driving circuitry and this causes an adjustment of a frequency of the drive signal for a second excitation time period.

2. The resonant sensing system of claim 1, wherein the driving circuitry sends the drive signal having the adjusted frequency to the sensing device during the second excitation time period and this drive signal causes the beams of the sensing device to mechanically oscillate and generate a second induced electromotive force (emf) in response to the drive signal.

3. The resonant sensing system of claim 2, wherein the signal conditioning interface circuitry to receive a sense signal associated with the second induced emf during a second measurement time period.

4. The resonant sensing system of claim 3, further comprising:
digital circuitry to control switching of the first and second switches between excitation and measurement periods until an extracted frequency of the conditioned sense signal matches a frequency of the drive signal and this causes the sensing device to be mechanically oscillating at a natural resonant frequency of the sensing device.

5. The resonant sensing system of claim 1, wherein the frequency detection circuitry comprises a digital core to perform frequency extraction utilizing fast fourier transform techniques.

6. The resonant sensing system of claim 1, wherein the frequency detection circuitry comprises a comparator and a digital counting circuitry to extract a frequency of the conditioned sense signal by counting a number of zero crossings within a pre-defined time period.

7. The resonant sensing system of claim 1, wherein the sensing device includes the beams and a mass each being a conductive portion of a package-integrated resonant accelerometer which is fabricated using panel level processing.

* * * * *